(12) United States Patent
Yao et al.

(10) Patent No.: US 6,845,482 B2
(45) Date of Patent: Jan. 18, 2005

(54) INTERLEAVER FOR TURBO DECODER

(75) Inventors: Iwen Yao, San Diego, CA (US);
Da-Shan Shiu, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 492 days.

(21) Appl. No.: 09/853,332

(22) Filed: May 10, 2001

(65) Prior Publication Data

US 2002/0159423 A1 Oct. 31, 2002

Related U.S. Application Data

(60) Provisional application No. 60/272,123, filed on Feb. 28, 2001.

(51) Int. Cl.[7] ............................................. H03M 13/00
(52) U.S. Cl. ...................................................... 714/755
(58) Field of Search ......................................... 714/755

(56) References Cited

PUBLICATIONS

A unified turbo/Viterbi channel decoder for 3GPP mobile wireless in 0.18–/spl mu/m CMOS; Bickerstaff, M.A et al.; Solid–State Circuits, IEEE Journal of, vol.: 37, Issue: 11, Nov. 2002; pp.: 1555–1564.*

$3^{rd}$ Generation Partnership Project; Technical Specification Group Radio Access Network; Multiplexing and channel coding (FDD) Jun. 2000, pp. 1–62.

Barbulescu et al. Turbo Codes: a tutorial on a new class of powerful error correcting coding schemes. XP–002215242, pp. 1–48 (1999).

* cited by examiner

*Primary Examiner*—R. Stephen Dildine
(74) *Attorney, Agent, or Firm*—Philip R Wadsworth; Charles D Brown; George C. Pappas

(57) ABSTRACT

Techniques to efficiently generate memory addresses for a Turbo code interleaver using a number of look-up tables. An interleaver includes a storage unit, sets of tables, and an address generator. The storage unit stores K elements for a data packet at locations representative of an R×C array, with the elements being stored in a first (e.g., linear) order and provided in a second (e.g., interleaved) order. A first set of table(s) stores sequences (e.g., inter-row permutation sequences $P_A$, $P_B$, $P_C$, and $P_D$) used to perform row permutation of the array to map from the first order to the second order. A second set of table(s) stores sequences (e.g., intra-row base sequences and prime number sequences) used to perform column permutation. The address generator receives a first address for the first order and generates a corresponding second address for the second order based on sequences stored in the tables.

21 Claims, 10 Drawing Sheets

Stage 1
K = 40, R = 5, C = 8
p = 7, $g_0$ = 3

Stage 2 - intra-row permutation
$c(i) = \{1, 3, 2, 6, 4, 5\}$
$g_j = \{1, 7, 11, 13, 17\}$
$P_D = \{4, 3, 2, 1, 0\}$
$p_j = \{17, 13, 11, 7, 1\}$ Stage 3 - inter-row permutation
$P_D = \{4, 3, 2, 1, 0\}$

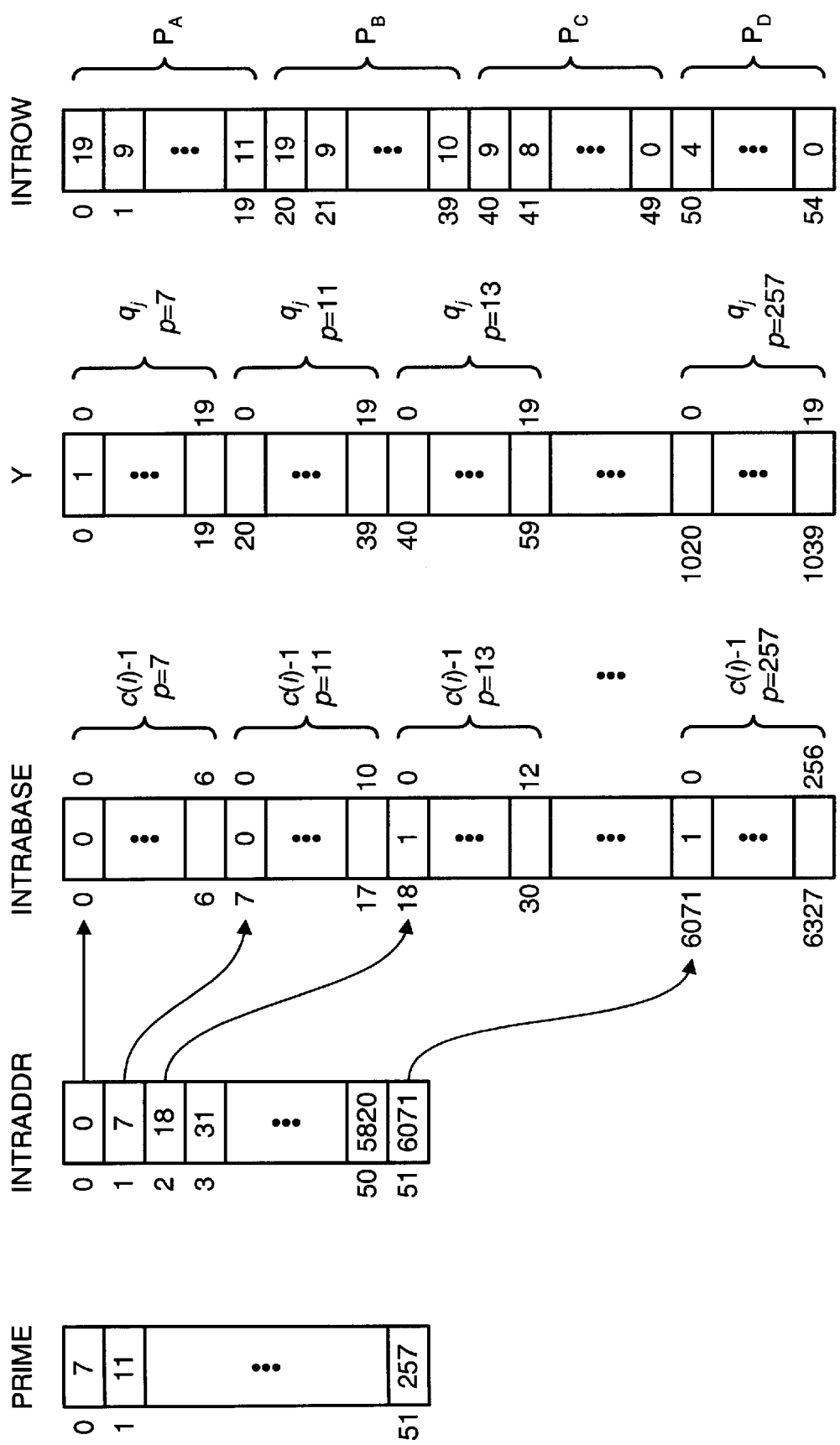

INTERLEAVER FOR TURBO DECODER

CROSS-REFERENCE TO RELATED APPLICATIONS

This application claims the benefit of U.S. Provisional Patent Application No. 60/272,123, filed Feb. 28, 2001.

BACKGROUND

1. Field

The present invention relates to data communication. More particularly, the present invention relates to a novel and improved interleaver for storing intermediate results for a Turbo decoder.

2. Background

Wireless communication systems are widely deployed to provide various types of communication such as voice, data, and so on. These systems may be based on code division multiple access (CDMA), time division multiple access (TDMA), or some other multiple access techniques. A CDMA system provides certain advantages over other types of system, including increased system capacity.

A CDMA system may be designed to conform to one or more CDMA standards such as the IS-95, cdma2000, and W-CDMA standards, which are known in the art. Each standard specifically defines the processing of data prior to transmission over the forward and reverse links. For example, speech information may be coded at a particular data rate, formatted into a defined frame format, and processed (e.g., encoded for error correction and/or detection, interleaved, and so on) in accordance with a particular processing scheme. The frame formats and processing defined by a particular standard (e.g., cdma2000 standard) are likely to be different from those of other standards (e.g., W-CDMA standard).

The W-CDMA standard employs a parallel concatenated convolutional encoder (often referred to as a Turbo encoder), which may be selected for encoding a code segment (i.e., a data packet) prior to transmission. The Turbo encoder employs two constituent encoders operated in parallel and in combination with a code interleaver. The code interleaver shuffles (i.e., interleaves) the information bits in the packet in accordance with a specifically defined interleaving scheme. One encoder encodes the information bits in the packet to generate a first sequence of parity bits, and the other encoder encodes the shuffled information bits to generate a second sequence of parity bits. The information bits and all or some of the parity bits in the first and second sequences are transmitted.

A complementary (and computationally intensive) Turbo decoding is performed at a receiver unit. For each Turbo encoded packet, the received bits are initially stored to a buffer. The information and parity bits for the first encoder are then retrieved from the buffer and decoded based on the first constituent code to provide "extrinsic" information indicative of adjustments in the confidence in the detected values for the information bits. Intermediate results that include the extrinsic information from the first decoder are then stored to a storage unit in an interleaved order matching the code interleaving used at the transmitter unit.

The intermediate results and the parity bits from the second encoder are then retrieved from their respective sources and decoded based on the second constituent code to provide extrinsic information indicative of further adjustments in the confidence in the detected values for the information bits. Intermediate results that comprise the extrinsic information from the second decoder are then stored to the storage unit in a deinterleaved order complementary to the code interleaving used at the transmitter unit. The intermediate results are used by the next iteration of the first constituent decoder. The decoding by the first and second constituent decoders is iterated a number of times to yield the final results.

For each information bit to be decoded, the storage unit is accessed to retrieve intermediate result generated for this bit by a prior decoding (if any). The intermediate result generated for each decoded bit is also stored back to the storage unit for use in a subsequent decoding. The storage unit is thus continually accessed as bits in the packet are decoded. For each memory access, the proper address needs to be generated such that the proper intermediate result is retrieved from the storage unit (for a read) or stored to the proper location (for a write).

As can be seen, efficient generation of addresses for memory accesses is highly desirable for efficient Turbo decoding, especially in light of a complicated interleaving scheme defined by the W-CDMA standard.

SUMMARY

Aspects of the invention provide techniques to efficiently generate memory addresses needed to perform interleaving for the Turbo code defined by the W-CDMA standard. In an aspect, to expedite address generation, a number of look-up tables (LUTs) are provided to store various sequences of values used to generate interleaved addresses. The use of these tables expedites address computations and allows the required addresses to be generated in less time. In another aspect, techniques are provided to efficiently generate interleaved addresses based on the tables. The interleaved address generation techniques may be used for Turbo encoding and is especially advantageous for Turbo decoding, which is computationally intensive. Expedient address generation is essential for efficient Turbo decoding, especially if a high data rate is supported and in light of the iterative nature of Turbo decoding.

A specific embodiment of the invention provides an interleaver for a concatenated convolutional (Turbo) code. The interleaver includes a storage unit, first and second sets of at least one table, and an address generator. The storage unit stores a plurality of (K) elements (e.g., intermediate results of Turbo decoding) for a data packet at locations representative of a two-dimensional (R×C) array, with the elements being stored into the storage unit in a first (e.g., linear) order and provided from the storage unit in a second (e.g., interleaved) order. The first set of table(s) stores a first set of sequences of values used to perform row permutation of the R×C array to map from the first order to the second order. For the W-CDMA standard, these sequences may include the inter-row permutation sequences $P_A$, $P_B$, $P_C$, and $P_D$. The second set of table(s) stores a second set of sequences of values used to perform column permutation of the R×C array. For the W-CDMA standard, these sequences may include intra-row base sequences $c(i)$ and either the prime number sequences $q_j$ or the permutated prime number sequences $p_j$, all of which are used to perform column permutation. The address generator receives a first address for the first order and generates a corresponding second address for the second order based in part on the sequences stored in the first and second sets of tables.

Various aspects, embodiments, and features of the invention are described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein:

FIG. 6A is a diagram that shows the order in which bits in a code segment are written to an R×C array for the Turbo interleaving scheme defined by W-CDMA standard;

FIG. 6B is a diagram that shows the interleaving for an example in which the code segment size K is 40;

FIG. 7 shows the tables that may be used to expedite the address generation for the interleaving scheme defined by the W-CDMA standard;

DETAILED DESCRIPTION

Figure 1:
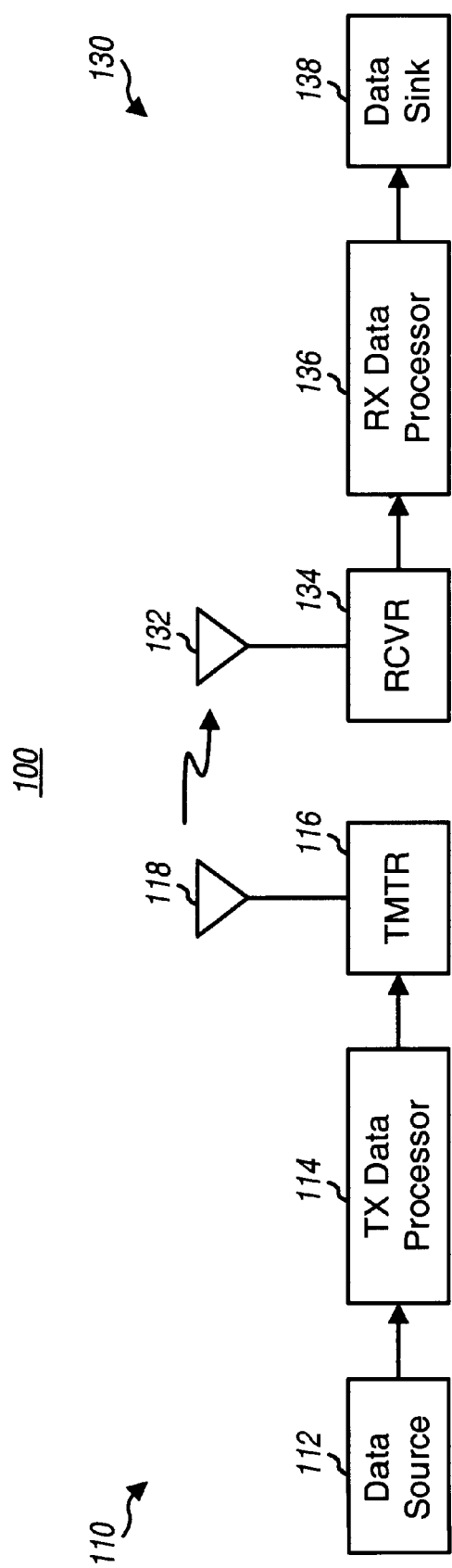
FIG. 1 is a simplified block diagram of a communication system capable of implementing various aspects of the invention.

FIG. 1 is a simplified block diagram of a communication system 100 capable of implementing various aspects of the invention. In a specific embodiment, communication system 100 is a CDMA system that conforms to the W-CDMA standard. At a transmitter unit 110, data is sent, typically in blocks, from a data source 112 to a transmit (TX) data processor 114 that formats, codes, and processes the data to generate one or more analog signals. The analog signals are then provided to a transmitter (TMTR) 116 that (quadrature) modulates, filters, amplifies, and upconverts the signal(s) to generate a modulated signal. The modulated signal is then transmitted via one or more antennas 118 (only one is shown in FIG. 1) to one or more receiver units.

At a receiver unit 130, the transmitted signal is received by one or more antennas 132 (again, only one is shown) and provided to a receiver (RCVR) 134. Within receiver 134, the received signal(s) are amplified, filtered, downconverted, (quadrature) demodulated, and digitized to generate samples. The samples are then processed and decoded by a receive (RX) data processor 136 to recover the transmitted data. The processing and decoding at receiver unit 130 are performed in a manner complementary to the processing and coding performed at transmitter unit 110. The recovered data is then provided to a data sink 138.

The signal processing described above supports transmissions of voice, video, packet data, messaging, and other types of communication in one direction. A bi-directional communication system supports two-way data transmission. However, the signal processing for the other direction is not shown in FIG. 1 for simplicity.

Figure 2A:
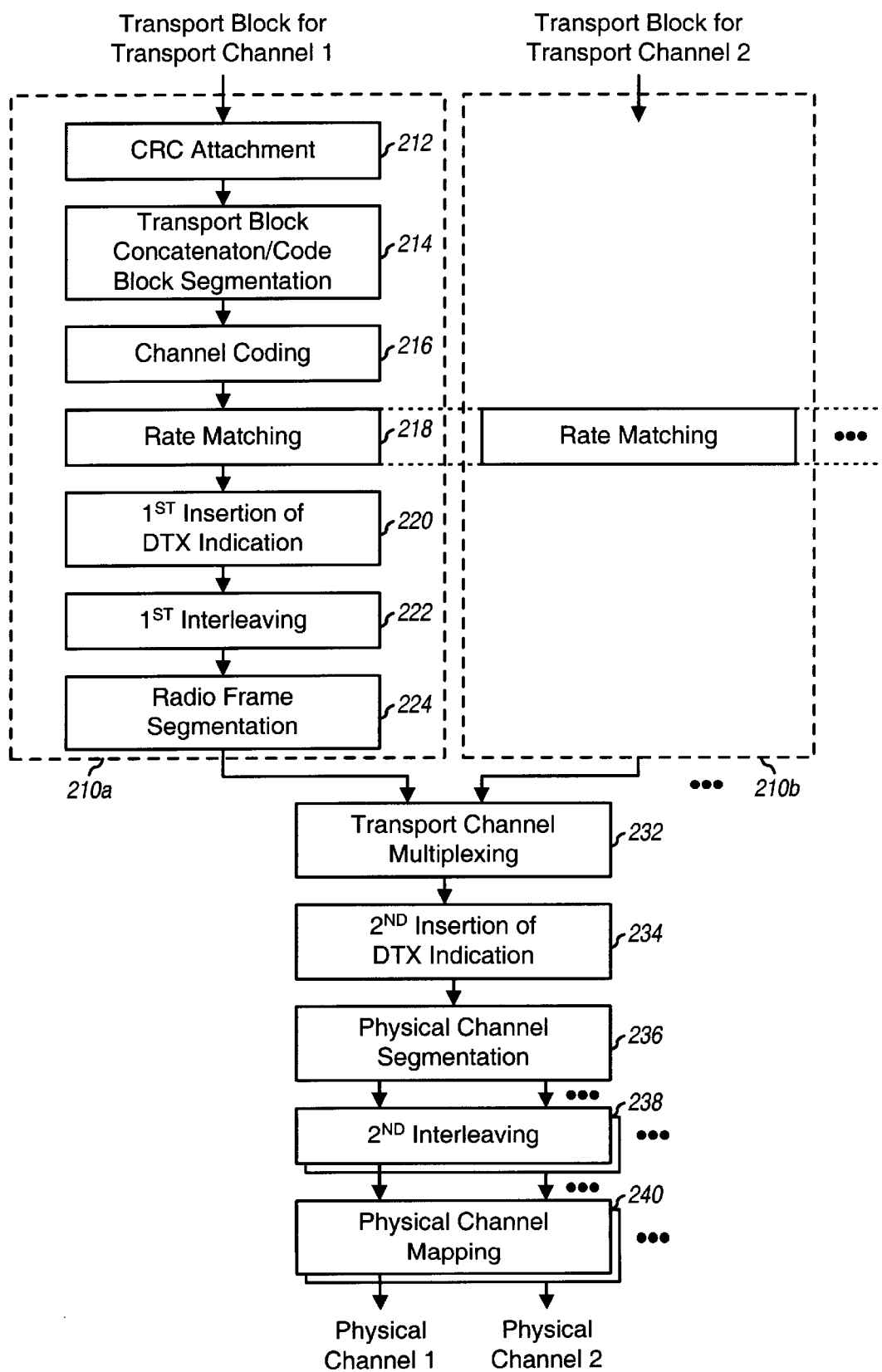
FIGS. 2A and 2B are diagrams of the signal processing at a transmitter unit and a receiver unit, respectively, for a downlink data transmission in accordance with the W-CDMA standard.

FIG. 2A is a diagram of the signal processing at transmitter unit 110 for a downlink data transmission in accordance with the W-CDMA standard. The downlink refers to transmission from a base station to a user terminal (or user equipment (UE)), and the uplink refers to transmission from the user terminal to the base station. The signal processing shown in FIG. 2A is generally performed by transmit data processor 114 in FIG. 1. The upper signaling layers of the W-CDMA system support concurrent transmission of a number of transport channels, with each transport channel capable of carrying data for a particular communication (e.g., voice, video, data, and so on). The data for each transport channel is provided, in blocks that are also referred to as transport blocks, to a respective transport channel processing section 210.

Within transport channel processing section 210, each transport block is used to calculate cyclic redundancy check (CRC) bits, in block 212. The CRC bits are attached to the transport block and used at the receiver unit for error detection. A number of CRC coded blocks are then serially concatenated together, in block 214. If the total number of bits after concatenation is greater than the maximum size of a code block, the bits are segmented into a number of (equal-sized) code blocks. Each code block is then coded with a particular coding scheme (e.g., a convolutional code, a Turbo code) or not coded at all, in block 216.

Rate matching is then performed on the code bits, in block 218. Rate matching is performed in accordance with a rate-matching attribute assigned by higher signaling layers. On the uplink, bits are repeated or punctured (i.e., deleted) such that the number of bits to be transmitted matches the number of bits available. On the downlink, unused bit positions are filled with discontinuous transmission (DTX) bits, in block 220. The DTX bits indicate when a transmission should be turned off and are not actually transmitted.

The bits are then interleaved in accordance with a particular interleaving scheme to provide time diversity, in block 222. In accordance with the W-CDMA standard, the time interval over which interleaving is performed can be selected from a set of possible time intervals (i.e., 10 msec, 20 msec, 40 msec, or 80 msec). The interleaving time interval is also referred to as a transmission time interval (TTI). The TTI is an attribute associated with each transport channel and, in accordance with the W-CDMA standard, does not change for the duration of a communication session. As used herein, a "traffic" comprises the bits within one TTI for a particular transport channel.

When the selected TTI is longer than 10 msec, the traffic is segmented and mapped onto consecutive transport channel radio frames, in block 224. Each transport channel radio frame corresponds to a transmission over a (10 msec) radio frame period. In accordance with the W-CDMA standard, a traffic may be interleaved over 1, 2, 4, or 8 radio frame periods.

The radio frames from all active transport channel processing sections 210 are then serially multiplexed into a coded composite transport channel (CCTrCH), in block 232. DTX bits may then be inserted to the multiplexed radio frames such that the number of bits to be transmitted matches the number of bits available on the physical channel (s) used for the data transmission, in block 234. If more than one physical channel is used, the bits are segmented among the physical channels, in block 236. A particular physical channel can carry transport channels having different TTIs. The bits in each radio frame period for each physical channel are then interleaved to provide additional time diversity, at block 238. The interleaved physical channel radio frames are then mapped to their respective physical channels, at block 240. The subsequent signal processing to generate a modulated signal suitable for transmission to a user terminal is known in the art and not described herein.

Figure 2B:
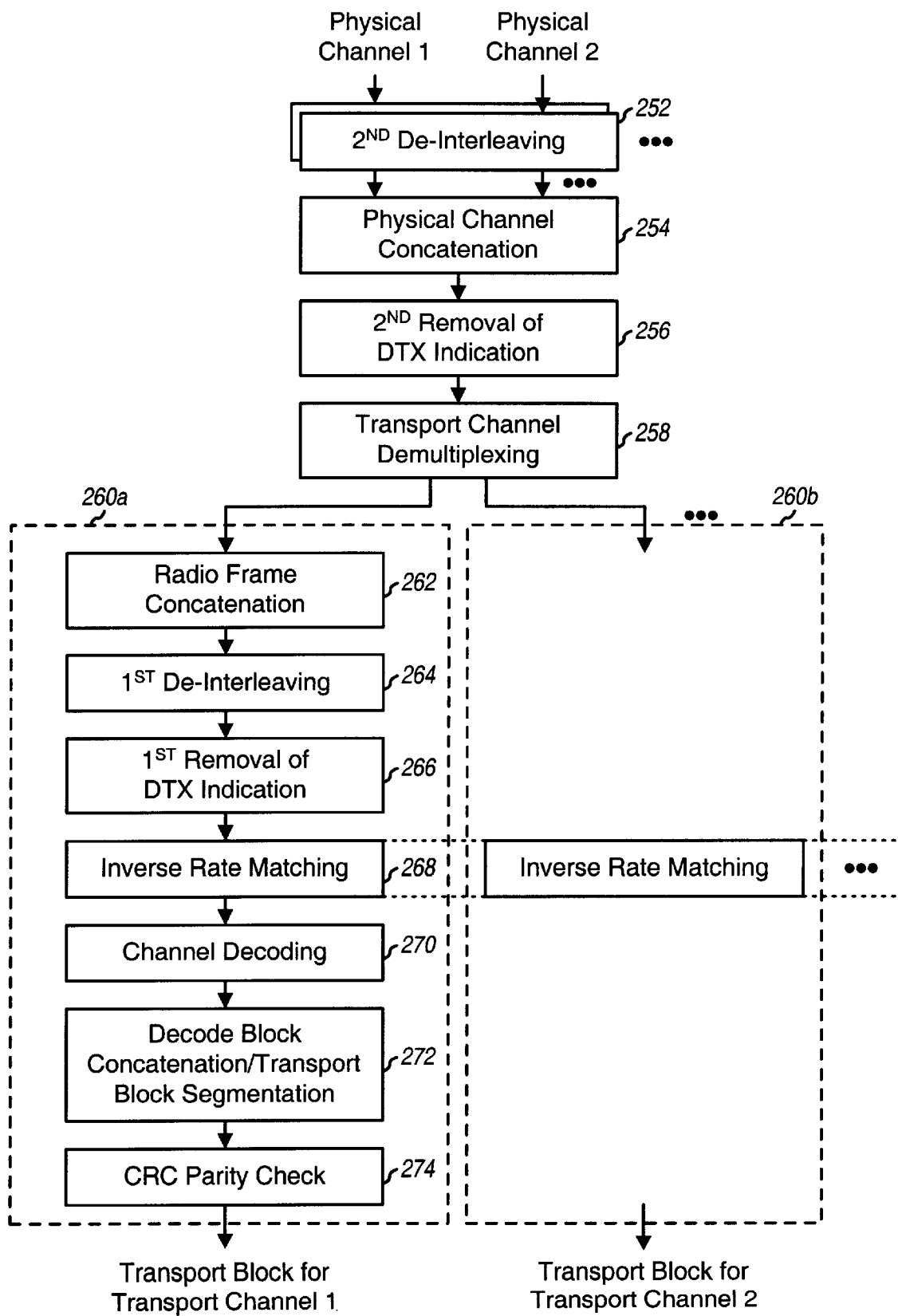

FIG. 2B is a diagram of the signal processing at receiver unit 130 for a downlink data transmission in accordance with the W-CDMA standard. The signal processing shown in FIG. 2B is complementary to that shown in FIG. 2A, and is generally performed by receive data processor 136 in FIG. 1. Initially, the modulated signal is received, conditioned, digitized, and processed to provide symbols for to each physical channel used for the data transmission. Each symbol has a particular resolution (e.g., 4 bits or more) and corresponds to a transmitted bit. The symbols in each radio frame period for each physical channel are de-interleaved, in block 252, and the de-interleaved symbols from all physical channels are concatenated, in block 254. For a downlink transmission, non-transmitted bits are detected and removed, in block 256. The symbols are then demultiplexed into various transport channels, in block 258. The radio frames for each transport channel are then provided to a respective transport channel processing section 260.

Within transport channel processing section 260, the transport channel radio frames are concatenated into traffics, in block 262. Each traffic includes one or more transport channel radio frames and corresponds to a particular TTI used at the transmitter unit. The symbols within each traffic are de-interleaved, in block 264, and non-transmitted symbols are removed, in block 266. Inverse rate matching is then performed to accumulate repeated symbols and insert "don't cares" for punctured symbols, in block 268. Each coded block in the traffic is then decoded, in block 270. The decoded blocks are then concatenated and segmented into their respective transport blocks, in block 272. Each transport block is then checked for error using the CRC bits, in block 274.

Figure 3:
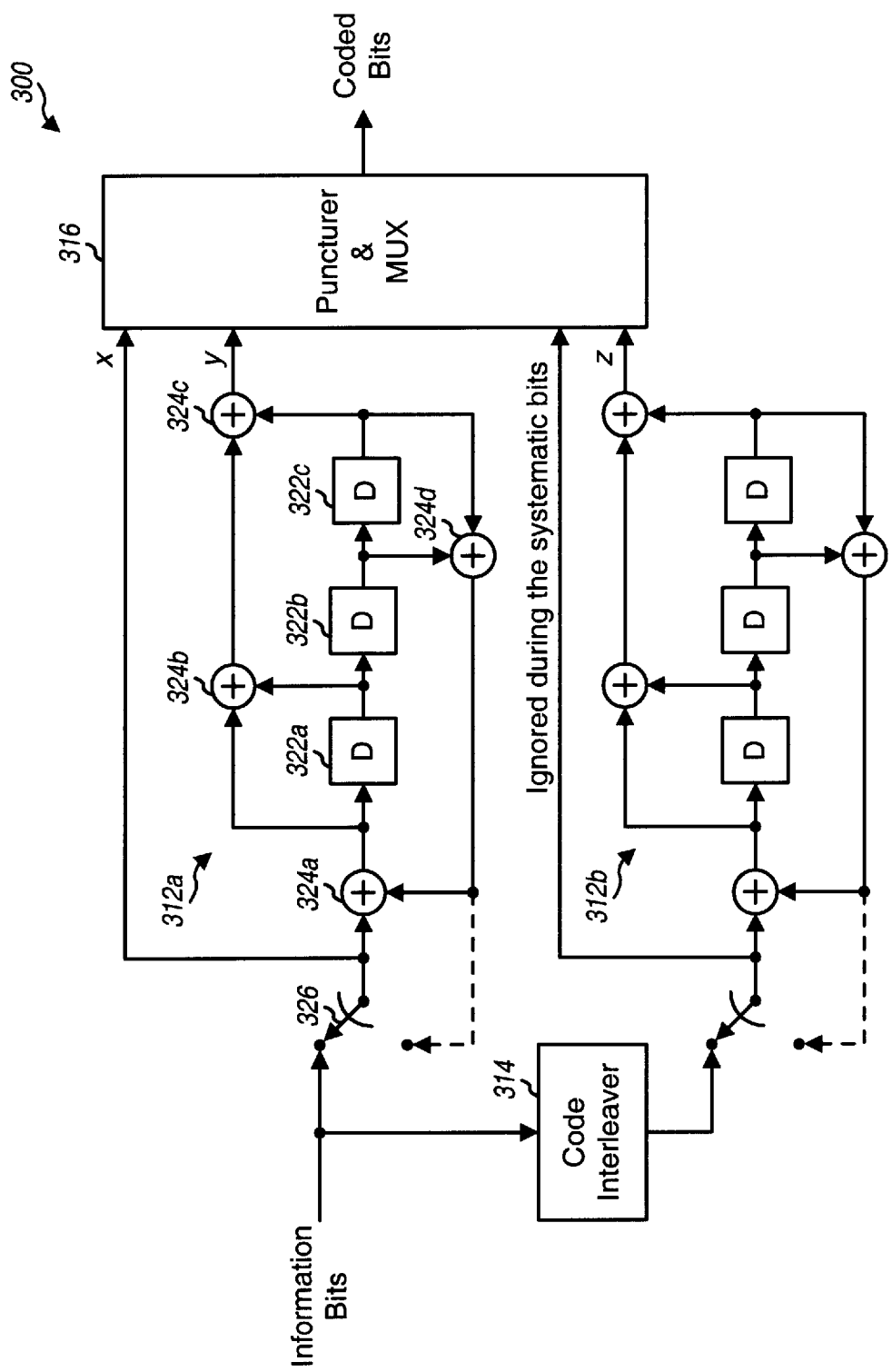
FIG. 3 is a diagram of a Turbo encoder defined by the W-CDMA standard.

FIG. 3 is a diagram of a parallel concatenated convolutional encoder 300 (which is also referred to as a Turbo encoder) defined by the W-CDMA standard. Turbo encoder 300 may be used to perform the channel coding in block 216 in FIG. 2A. Turbo encoder 300 includes a pair of constituent encoders 312a and 312b, a code interleaver 314, and a puncturer and multiplexer 316. Code interleaver 314 receives and interleaves the information bits in a code segment (i.e., a packet) in accordance with a particular interleaving scheme defined by the W-CDMA standard and described in further detail below.

Each constituent encoder 312 receives either linear-order or interleaved information bits, encodes the received information bits with a defined constituent code, and provides a sequence of parity bits. Puncturer and multiplexer 316 receives the information bits and the parity bits from both encoders 312a and 312b, punctures (i.e., deletes) zero or more parity bits to obtain the desired number of bits, and multiplexes the unpunctured information and parity bits into a sequence of coded bits.

Each constituent encoder 312 includes three series-coupled delay elements 322, four modulo-2 adders 324, and a switch 326. Initially, the states of delay elements 322 are set to zeros and switch 326 is in the up position. Then, for each information bit in the data packet, adder 324a performs modulo-2 addition of the information bit x with the output bit from adder 324d and provides the result to delay element 322a. Adders 324b and 324c receive and perform modulo-2 addition of the bits from adder 324a and delay elements 322a and 322c, and provide the parity bit y. Adder 324d performs modulo-2 addition of the bits from delay elements 322b and 322c.

After all N information bits in the data packet have been encoded, switch 326 is moved to the down position and three zero ("0") tail bits are provided to constituent encoder 312a. Constituent encoder 312a then encodes the three tail bits and provides three tail parity bits.

For each packet of N information bits, constituent encoder 312a provides N parity bits y and the first six tail parity bits, and constituent encoder 312b provides N parity bits z and the last six tail parity bits. For each packet, puncturer and multiplexer 316 receives N information bits, N+6 parity bits from encoder 312a, and N+6 parity bits from encoder 312b. Puncturer and multiplexer 316 may puncture a number of parity bits to provide the required number of coded bits, which comprises the unpunctured information and parity bits.

Figure 4:
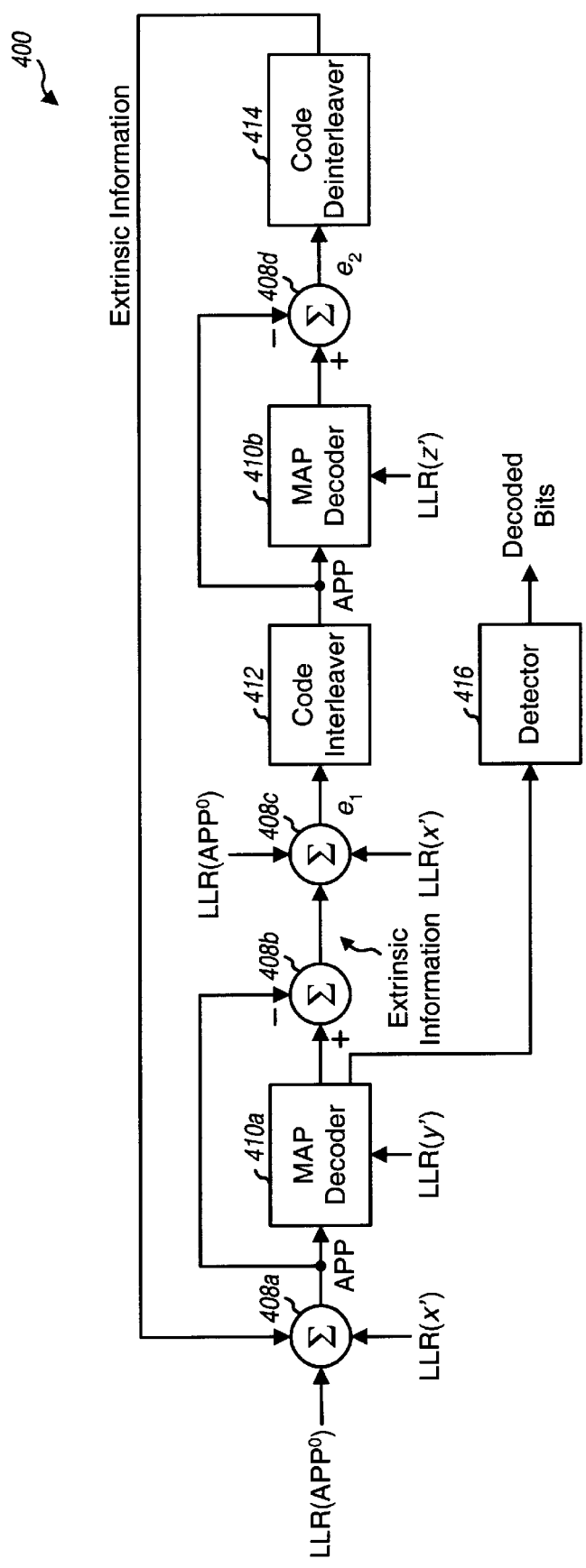
FIG. 4 is a block diagram of a specific Turbo decoder design.

FIG. 4 is a block diagram of a design of a Turbo decoder 400. In this design, Turbo decoder 400 includes two constituent decoders 410a and 410b, a code interleaver 412, a code deinterleaver 414, and a detector 416. Each decoder 410 is typically implemented as a soft-input/soft-output (SISO) maximum a posteriori (MAP) decoder. However, other types of decoder may also be used, such as a decoder that implements the soft output Viterbi algorithm (SOVA). The design of the decoder is typically dependent on the particular Turbo coding scheme used at the transmitter unit.

The received (soft) bits corresponding to the transmitted coded bits are deinterleaved by a channel deinterleaver (not shown in FIG. 4) to undo the first and second interleaving performed at the transmitter unit (blocks 222 and 238 in FIG. 2A). For each data packet to be decoded, the channel-deinterleaved bits are provided to decoders 410a and 410b as needed.

In the embodiment shown in FIG. 4, a summer 408a receives and sums $LLR(APP^0)$, $LLR(x')$, and the extrinsic information from deinterleaver 414 to provide a priori probabilities (APP) for decoder 410a. $LLR(APP^0)$ is the log likelihood ratio derived from an underlying assumption of the information bits. If each information bit in a data packet is assumed to be equally likely to be either zero ("0") or one ("1"), then $LLR(APP^0)$ is equal to zero for all received bits in the packet, and any parts related to $LLR(APP^0)$ are ignored. The extrinsic information from deinterleaver 414 is set to zero for the first decoding iteration. $LLR(x')$ is the log-likelihood ratio of the received information bits x'. The LLR of each received information and parity bit, $b_m$, can be computed as:

$$LLR(b_m) = \log\left(\frac{P(b_m = 0)}{P(b_m = 1)}\right).$$

The LLR of a received bit is the logarithm of the ratio of the probability of the bit being a zero over the probability of the bit being a one. The probabilities, $P(b_m=0)$ and $P(b_m=1)$, for each received bit are typically based on the soft value for that bit. The LLR for an erasure (i.e., punctured bit) is indicative of equal confidence in the bit being a zero or a one (i.e., LLR=0).

Decoder 410a receives the APP from summer 408a and $LLR(y')$, which are the LLRs of the received parity bits, y', from the first constituent encoder. $LLR(y')$ includes erasures for punctured (i.e., non-transmitted) parity bits, if any. Decoder 410a then decodes the APP and $LLR(y')$ in accordance with the MAP algorithm to generate a posteriori probabilities. The APP is then subtracted from the a posteriori probabilities by a summer 408b to provide extrinsic information, $e_1$, which is indicative of corrections/ adjustments in the confidence of the values for the received information bits x' contributed by the received parity bits y'.

The extrinsic information, $e_1$, from summer 408b is summed with the information bit LLRs, LLR(x'), and the intermediate results (which are APP for the next decoder) are stored to code interleaver 412. Code interleaver 412 implements the same code interleaving scheme used at the Turbo encoder (e.g., the same scheme used for code interleaver 314 in FIG. 3).

Decoder 410b receives the interleaved APP from interleaver 412 and LLR(z'), which are the LLRs of the received parity bits, z', from the second constituent encoder. Decoder 410b then decodes the APP and LLR(z') in accordance with the MAP algorithm to generate a posteriori probabilities. The APP is then subtracted from the a posteriori probabilities by a summer 408d to provide extrinsic information, $e_2$, which is indicative of further corrections/adjustments in the confidence of the values for the received information bits x' contributed by the received parity bits z'. The extrinsic information $e_2$ comprises the intermediate results from decoder 410b, which are stored to code deinterleaver 414. Deinterleaver 414 implements a deinterleaving scheme complementary to the interleaving scheme used for interleaver 412.

The decoding of the information bit LLRs is iterated a number of times (e.g., 6, 8, 10, or possibly more times). With each iteration, greater confidence is gained for the detected values of the information bits. After all the decoding iterations have been completed, the final LLRs are provided to detector 418, which provides hard-decision values (i.e., "0s" and "1s") for the received information bits based on their LLRs.

Figure 5:
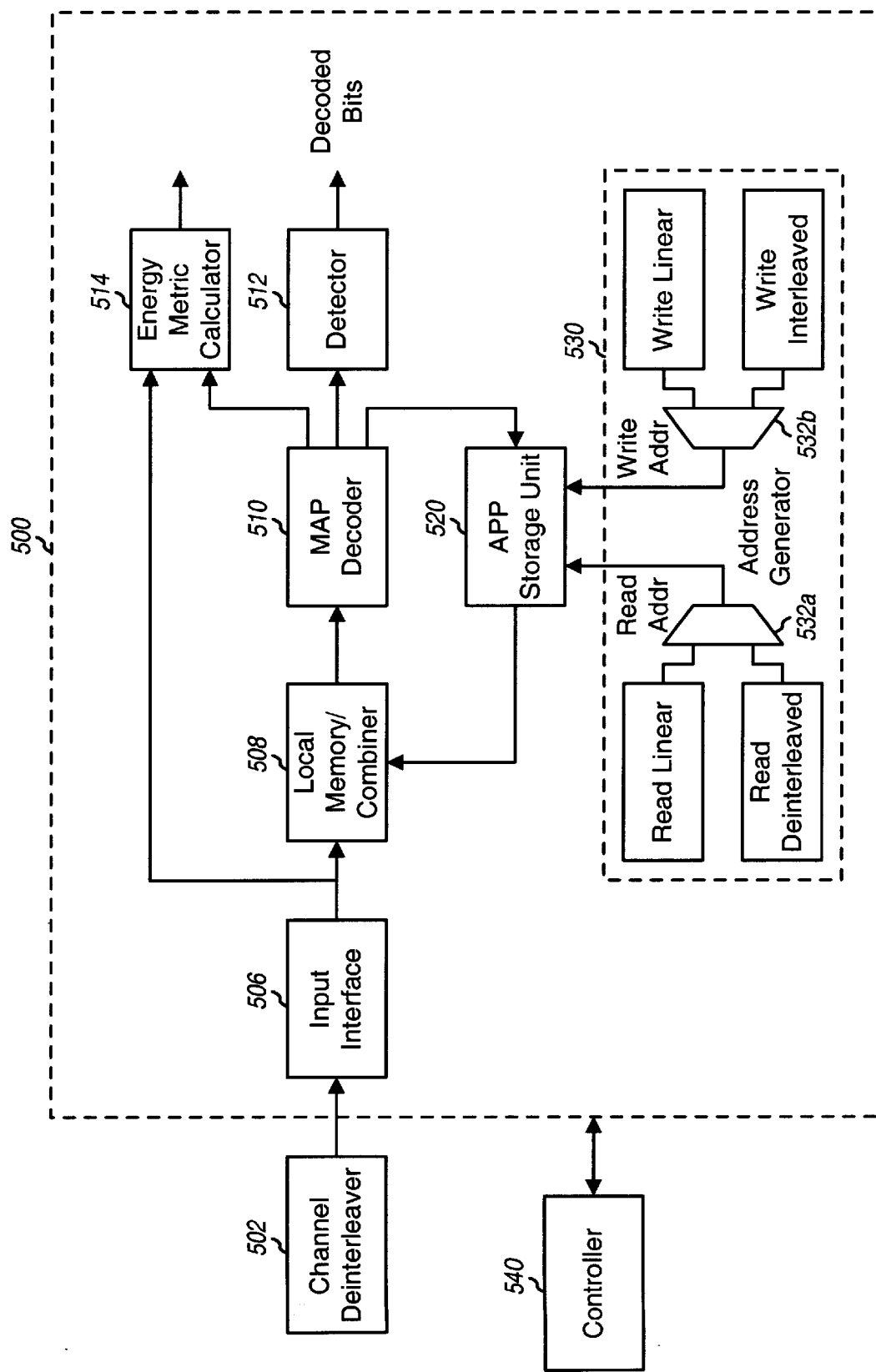
FIG. 5 is a block diagram of a specific Turbo decoder implementation.

FIG. 5 is a block diagram of a Turbo decoder 500, in accordance with an embodiment of the invention. Turbo decoder 500 is one specific implementation of Turbo decoder 400 in FIG. 4. In this embodiment, Turbo decoder 500 includes an input interface unit 506, a local memory/combiner 508, a SISO MAP decoder 510, a detector 512, an energy metric calculator 514, a storage unit 520, and an address generator 530. Referring back to FIG. 4, the two constituent decoders 410a and 410b are operated in series, with the extrinsic information from one decoder being provided as an input to the other decoder. Because of the serial operation of the two constituent decoders, only one (physical) decoder can be used to implement both constituent decoders.

Input interface unit 506 provides the interface between a channel deinterleaver 502 and MAP decoder 510. For some systems, input interface unit 506 may be designed to provide de-puncturing of the coded bits, if puncturing was performed at the transmitter unit. The de-puncturing is achieved by providing an erasure for each punctured bit, with the erasure being indicative of equal likelihood of the bit being a zero or a one.

Depending on the particular decoding pass being performed (i.e., decoding for the first or second constituent encoder), the proper sequence of information and parity bits is provided to memory/combiner 508 from channel deinterleaver 502. APP obtained from the prior iteration is also provided to memory/combiner 508 from storage unit 520. In an embodiment, memory/combiner 508 is designed to (1) receive and compute LLR for the received (soft) information bits, x', (2) combine the LLR(x') computed in step (1) and the corresponding extrinsic information to generate APP, and (3) receive and compute LLR for the received parity bits, y' or z'.

In an embodiment, memory/combiner 508 is implemented using a sliding window architecture (SWA) that temporarily stores, e.g., four windows worth of information and parity bits. While three windows of information and parity bits are being operated on by three state metric calculators within decoder 510, the fourth window is updated with values from channel deinterleaver 502 and storage unit 520. In an embodiment, each window has a size of 32, i.e., each window holds 32 x' symbols and 32 y' (or z') symbols. Other window lengths and/or different number of windows may also be used.

In an embodiment, decoder 510 implements a SISO decoder that executes a log-MAP algorithm. Any MAP-based decoding algorithm (e.g., a max log-MAP algorithm or a max* log-MAP algorithm, both of which are known in the art) may also be used. In an embodiment, to implement the MAP algorithm, decoder 510 includes one forward state metric calculator and two backward state metric calculators. Each forward (or backward) state metric calculator computes the logarithm of the probability of each of $2^{K-1}$ states in the trellis at a given current time instance based on (1) the probabilities of the states at a previous (or future) time instance and (2) the probabilities of the path between the previous (or future) states and the state in the current time, where K is the constraint length of the constituent encoder. These forward and backward state metrics ($\alpha$ and $\beta$, respectively) are then used to compute a posteriori probabilities for the information bits. The forward and backward state metric calculations and Turbo decoding are described in greater detail by Steven S. Pietrobon in a paper entitled "Implementation and Performance of a Turbo/Map Decoder," International Journal of Satellite Communications, Vol. 16, 1998, pp. 23–46, which is incorporated herein by reference.

The output of decoder 510 is stored to storage unit 520. In an embodiment, storage unit 520 is operated to store the APP symbols from decoder 510 in interleaved order (as oppose to linear order, which may also be used). Storing the intermediate results in interleaved order may simplify the partitioning of the memory into multiple banks for ease of access and further allows for the use of the same interleaving address generator for both the Turbo encoder and decoder. In an embodiment, storage unit 520 is further operated to store APP symbols from the first constituent decoding and extrinsic information from the second constituent decoding.

For the first constituent decoding, extrinsic information from a previous second constituent decoding is retrieved from storage unit 520 in deinterleaved order, and APP symbols generated by the decoding are stored to storage unit 520 in interleaved order. Correspondingly, for the second constituent decoding, APP symbols from a previous first constituent decoding are retrieved from storage unit 520 in linear order, and extrinsic information generated by the decoding is stored to storage unit 520 in linear order.

In an embodiment, storage unit 520 is partitioned into, and implemented with, a number of banks. The banks are assigned and operated in a manner to avoid double buffering of the APP data. Each bank may be implemented such that it can be accessed separately and independently from the other banks. This can be achieved by providing each bank with its own set of address and data lines.

Address generator 530 provides the write and read addresses for storage unit 520. A multiplexer 532a is symbolically shown in FIG. 5 to indicate that the APP symbols/extrinsic information may be written to storage unit 520 in linear or interleaved order, and a multiplexer 532b is symbolically shown to indicate that the APP symbols/extrinsic information may be retrieved from the storage unit in linear or deinterleaved order.

Detector 512 receives the APP symbols after the last decoding iteration and provides hard decisions for the received information bits. Energy metric calculator 514 provides an energy metric for the information bits (or their LLRs). The energy metric may be used as another indication of the confidence in the detected information bits.

As shown in FIG. 5, a controller 540 may direct the operation of Turbo decoder 500 and may further provide various parameters needed for the Turbo decoding (e.g., the code segment size K).

For the Turbo decoder design in FIG. 5, storage unit 520 stores APP data from the first constituent decoder and extrinsic information from the second constituent decoder. The APP data and extrinsic information are two different forms of intermediate results from the constituent decoder. As used herein, intermediate results can comprise any information that is passed from one constituent decoder to a subsequent decoder, and may take on any form. Typically, the particular form of intermediate results to be stored from any constituent decoder is dependent on the specific design of the Turbo decoder.

The code interleaving is an important and integral part of the Turbo encoder and decoder. Whatever scheme is selected for the code interleaving at the Turbo encoder, the same scheme is used to store/retrieve the APP symbols from the first constituent decoding, and a complementary scheme is used to store/retrieve the extrinsic information for the second constituent decoding.

The W-CDMA standard defines a specific interleaving scheme for the Turbo encoder. This interleaving scheme may be partitioned into three stages: (1) writing the information bits in a code segment (i.e., a data packet) row-by-row into an R×C array, (2) rearranging the elements within each row (i.e., intra-row permutation), and (3) interchanging the rows (i.e., inter-row permutation). The bits are thereafter read from the R×C array column-by-column, starting with the upper left-most element in the R×C array. These three stages are described in further detail below, and an example is provided thereafter for a better understanding of the interleaving scheme.

In the first stage, the bits in each code segment are written into the R×C array. The W-CDMA standard supports code segments of various sizes ranging from 40 to 5114 bits. Initially, the number of rows, R, in the array is determined based on the size of the code segment, K, as follows:

R=5, if 40≦K≦159;
R=10, if 160≦K≦200 or 481≦K<530; or
R=20, for all other K.

The number of columns, C, in the array is next determined based on R and K, as follows:

C=53, if 481≦K≦530; otherwise,
select a prime number p such that (p+1)·R≧K, and then select C=min {p−1, p, p+1} such that R·C≧K.

Once R and C are determined for a given K, the bits in the code segment are written row-by-row into the R×C array. Since K≦R·C, there may be empty cells at the bottom of the array (i.e., one or more rows, or a portion thereof, may not include any bits).

FIG. 6A is a diagram that shows the order in which bits in a code segment are written to the R×C array. The array is filled one row at a time, starting from the upper left hand corner of the array. If the number of bits in the code sequence is not equal to the size of the array (i.e., K≠R·C), then there are empty cells in the bottom row(s) of the array, as shown by the shaded cells.

In the second stage, the elements in each row are permutated (i.e., shuffled) based on an intra-row permutation sequence, $c_j(i)$, specifically defined for that row. The intra-row permutation may be performed in a series of steps. In the first step, a base sequence $c(i)$ of length p is generated. For each possible prime number p determined in the first stage, there is a primitive root, $g_0$, associated with that prime number, as defined by the W-CDMA standard and shown in Table 1. The elements of the base sequence $c(i)$ can be derived as:

$$c(i)=[g_0 \cdot c(i-1)]\mathrm{modulo}(p), \text{ for } i=1, 2, \ldots, (p-1), \quad \text{Eq (1)}$$

where $c(0)=1$.

TABLE 1

| p | $g_0$ | p | $g_0$ | p | $g_0$ | p | $g_0$ | p | $g_0$ |
|---|---|---|---|---|---|---|---|---|---|
| 7 | 3 | 47 | 5 | 101 | 2 | 157 | 5 | 223 | 3 |
| 11 | 2 | 53 | 2 | 103 | 5 | 163 | 2 | 227 | 2 |
| 13 | 2 | 59 | 2 | 107 | 2 | 167 | 5 | 229 | 6 |
| 17 | 3 | 61 | 2 | 109 | 6 | 173 | 2 | 233 | 3 |
| 19 | 2 | 67 | 2 | 113 | 3 | 179 | 2 | 239 | 7 |
| 23 | 5 | 71 | 2 | 127 | 3 | 181 | 2 | 241 | 7 |
| 29 | 2 | 73 | 7 | 131 | 2 | 191 | 19 | 251 | 6 |
| 31 | 3 | 79 | 3 | 137 | 3 | 193 | 5 | 257 | 3 |
| 37 | 2 | 83 | 2 | 139 | 2 | 197 | 2 | | |
| 41 | 6 | 89 | 3 | 149 | 2 | 199 | 3 | | |
| 43 | 3 | 97 | 5 | 151 | 6 | 211 | 2 | | |

In the second step of the second stage, a sequence of R prime numbers, $q_j$, is constructed. The elements of this prime number sequence are selected such that the following criteria are satisfied:

$$g.c.d. \{q_j, p-1\}=1;$$

$$q_j>6; \text{ and}$$

$$q_j>q_{j-1}, \quad \text{Eq (2)}$$

g.c.d. is the greatest common divider and $g_0=1$.

The prime number sequence $q_j$ is essentially a sequence of increasing minimum prime numbers, which excludes prime numbers that are factors of (p−1). The R elements in this prime number sequence $q_j$ are respectively associated with rows of the array. Each of the R elements in the sequence $q_j$ is later used to compute an intra-row permutation sequence $c_j(i)$ for the associated row, as described in further detail below.

Since elements at indices 0 through R−1 in the prime number sequence $q_j$ are respectively associated with rows 0 through R−1, and since the rows are subsequently permutated with an inter-row permutation sequence $P_X$ after the intra-row permutation, the elements in the prime number sequence $q_j$ are also permutated using the same inter-row permutation sequence $P_X$. The sequence $P_X$ is selected for the code segment from four possible sequences, $P_A$, $P_B$, $P_C$, and $P_D$, as described in further detail below. The elements of the permutated prime number sequence $p_j$ are determined as:

$$p_j=p_{P_X(j)}=q_j, \text{ for } j=0, 1, \ldots, R-1. \quad \text{Eq (3)}$$

In the third step of the second stage, an intra-row permutation sequence $c_j(i)$ for each row is determined as follows:

$$c_j(i)=c([i \cdot p_j]\mathrm{modulo}(p-1)), \text{ for } i=0, 1, \ldots, (p-2), \quad \text{Eq (4)}$$

where $c_j(p-1)=0$, j is the index of the row after the inter-row permutation, $c(x)$ is the $x^{th}$ element of the base sequence $c(x)$ derived above in equation (1), and $c_j(i)$ is the input bit position of the $i^{th}$ output after the permutation of the $j^{th}$ row. The intra-row permutation sequence $c_j(i)$ for each row j is thus derived based on the base sequence $\underline{c}(x)$ and the prime number $p_j$ in the permutated prime number sequence $\underline{p}_j$ associated with that row. Elements in each row are permutated such that the $i^{th}$ cell location in the permutated row is stored with the element stored in the $c_j(i)^{th}$ cell location in the original row.

As noted above, C can be equal to p−1, p, or p+1. Thus, the intra-row permutation sequence $\underline{c}_j(i)$ is used as follows:

If $C=p-1$, use $c_j(i)-1$ for $i=0, 1, 2, \ldots$ (p−2);

Else if $C=p$, use $c_j(i)$ for $i=0, 1, 2, \ldots$ (p−2), and $c_j(p-1)=0$;

and

Else if $C=p+1$, use $c_j(i)$ for $i=0, 1, 2, \ldots$ (p−2), and $c_j(p-1)=0$, $c_j(p)=p$, and if $R \cdot C = K$, then exchange $c_{R-1}(p)$ with $c_{R-1}(0)$.     Eq (5)

In the third stage, the R rows in the array are permutated based on the inter-row permutation sequence $P_X$, which is selected from among four possible sequences, $P_A$, $P_B$, $P_C$, and $P_D$, defined by the W-CDMA standard as follows:

$P_A = \{19, 9, 14, 4, 0, 2, 5, 7, 12, 18, 10, 8, 13, 17, 3, 1, 16, 6, 15, 11\}$, $P_B = \{19, 9, 14, 1, 0, 2, 5, 7, 12, 18, 16, 13, 17, 15, 3, 1, 6, 11, 8, 10\}$, $P_C = \{9, 8, 7, 6, 5, 4, 3, 2, 1, 0\}$, and $P_D = \{4, 3, 2, 1, 0\}$.

The particular inter-row permutation sequence to use for the code segment is selected based on the following:

$P_A$ is selected if K belongs to [201, 480], [531, 2280], [2481, 3160], or [3211, 5114] bits.

$P_B$ is selected if K belongs to [2281, 2480] or [3161, 3210].

$P_C$ is selected if K belongs to [160, 200] or [481, 530] (i.e., K=10).

$P_D$ is selected if K belongs to [40, 155] (i.e., use $P_D$ whenever R=5).

The inter-row permutation is performed such that the $j^{th}$ row in the original array is moved to the $P_X(j)$ row location in the permutated array.

After the inter-row permutation, the bits are read out column-by-column from the R×C array, and from top-to-bottom (i.e., from row 0 through row R−1). As noted above, since $K \leq R \cdot C$, some cells in the array may not contain valid data and these cells are skipped when reading out the data.

For clarity, an example is provided below for the above-described interleaving scheme. In this example, K=40 and results in a selection of R=5. The prime number p is then determined as p=7 and the number of column C is determine as C=8. For this prime number p, the associated primitive root $g_0=3$. The parameters can be summarized as follows:

K=40, R=5, C=8, p=7, and $g_0=3$.

Using equation (1), the base sequence $\underline{c}(i)$ is determined as:

$\underline{c}(i) = \{1, 3, 2, 6, 4, 5\}$.

The prime number sequence $q_j$ next derived from equation set (2) as:

$q_j = \{1, 7, 11, 13, 17\}$.

For this K=40, the inter-row permutation sequence $P_D$ is selected. The permutated prime number sequence $\underline{p}_j$ is generated from the prime number sequence $q_j$ based on the equality $p_{P_A(j)} = q_j$, to provide the following:

$\underline{p}_j = \{17, 13, 11, 7, 1\}$.

The intra-row permutation sequence $\underline{c}_j(i)$ for each row j is then determined based on permutated prime number $p_j$ for that row and the base sequence $\underline{c}(i)$. For the first row (j=0), the permutated prime number for the row is $p_0=17$ and the intra-row permutation sequence $\underline{c}_0(i)$ is determined as:

$\underline{c}_0(i) = c([i \cdot p_0] \text{ modulo}(p-1))$, for $i = 0, 1, \ldots 5$, $= c([i \cdot 17] \text{ modulo } 6)$, $= \{1, 5, 4, 6, 2, 3\}$.

Since C=p+1, $c_j(6)=0$ and $c_j(7)=7$. The intra-row permutation sequences for the five rows can then be expressed as:

$\underline{c}_0(i) = \{1, 5, 4, 6, 2, 3, 0, 7\}$, $\underline{c}_1(i) = \{1, 3, 2, 6, 4, 5, 0, 7\}$, $\underline{c}_2(i) = \{1, 5, 4, 6, 2, 3, 0, 7\}$, $\underline{c}_3(i) = \{1, 3, 2, 6, 4, 5, 0, 7\}$, and $\underline{c}_4(i) = \{1, 3, 2, 6, 4, 5, 0, 7\}$.

FIG. 6B is a diagram that shows the interleaving for the above example in which K=40. In the first stage, the parameters are determined as follows: K=40, R=5, C=8, p=7, and $g_0=3$. The bits in the code segment are then written into an R×C (5×8) array 710 row-by-row, starting at column 0 of row 0 and finishing at column 7 of row 4, as shown in FIG. 6B.

For the second stage, the base sequence $\underline{c}(i)$ is first derived, and the prime number sequence $q_j$ is then determined and permutated to derive the permutated prime number sequence $\underline{p}_j$. The intra-row permutation sequence $\underline{c}_j(i)$ for each of the five rows is then determined as shown above. The elements in each row of the R×C array are then shuffled based on the intra-row permutation sequence $\underline{c}_j(i)$ associated with that row. For example, for row 0, the cells at row indices {0, 1, 2, 3, 4, 5, 6, 7} in an intra-row permutated array 712 are filled with cell values from row indices {1, 5, 4, 6, 2, 3, 0, 7} in the original array 710. Similarly for row 1, the cells at row indices {0, 1, 2, 3, 4, 5, 6, 7} in array 712 are filled with cell values from row indices {1, 3, 2, 6, 4, 5, 0, 7} in array 710. Also, since K=R·C, the cell at row index $c_{R-1}(7)$ is swapped with the cell at row index $c_{R-1}(0)$, where $c_{R-1}(0)$ and $c_{R-1}(7)$ are the elements after the inter-row permutation.

For the third stage, the rows in array 712 are shuffled based on the inter-row permutation sequence $P_D$ to derive a final interleaved array 714. The cells in array 714 are then read out in the following order {34, 26, 18, 10, 8, 36, 28, ..., 16, 2}.

As shown above, the interleaving defined by W-CDMA standard is a complicated process. In a practical implementation, to achieve the interleaving, the bits for a code segment are stored to a memory unit in a particular order (e.g., either linear or interleaved) and are retrieved from the memory unit in the complementary order (i.e., interleaved or linear).

Aspects of the invention provide techniques to efficiently generate memory addresses needed to perform interleaving for the Turbo code defined by the W-CDMA standard. In an aspect, to expedite address generation, a number of look-up tables (LUTs) are provided to store various sequences of values used to generate interleaved addresses. The use of these tables expedites the address computations and allows the required addresses to be generated in less time. The address generation may thus not be the bottleneck for the Turbo decoding. Some of these tables and the sequences stored therein are described below.

In another aspect, techniques are provided herein to efficiently generate addresses based on the tables. The interleaved address generation techniques may be used for Turbo encoding and is especially advantageous for Turbo decoding, which is computationally intensive. Expedient address generation is essential for efficient Turbo decoding, especially if a high data rate is supported and in light of the iterative nature of Turbo decoding.

A PRIME table stores all prime numbers p that may be used. For all possible code segment sizes supported by the W-CDMA standard, there are a total of 52 prime numbers p. The PRIME table thus includes 52 entries, indexed from 0 through 51, for the 52 prime numbers, as shown in Table 2. Since the largest prime number is 257, each table entry may be implemented with 9 bits. A particular prime number may be retrieved by passing the proper index, pind, for the PRIME table.

TABLE 2

| index | p | index | p | index | p | index | p | index | p |
|---|---|---|---|---|---|---|---|---|---|
| 0 | 7 | 11 | 47 | 22 | 101 | 33 | 157 | 44 | 223 |
| 1 | 11 | 12 | 53 | 23 | 103 | 34 | 163 | 45 | 227 |
| 2 | 13 | 13 | 59 | 24 | 107 | 35 | 167 | 46 | 229 |
| 3 | 17 | 14 | 61 | 25 | 109 | 36 | 173 | 47 | 233 |
| 4 | 19 | 15 | 67 | 26 | 113 | 37 | 179 | 48 | 239 |
| 5 | 23 | 16 | 71 | 27 | 127 | 38 | 181 | 49 | 241 |
| 6 | 29 | 17 | 73 | 28 | 131 | 39 | 191 | 50 | 251 |
| 7 | 31 | 18 | 79 | 29 | 137 | 40 | 193 | 51 | 257 |
| 8 | 37 | 19 | 83 | 30 | 139 | 41 | 197 | | |
| 9 | 41 | 20 | 89 | 31 | 149 | 42 | 199 | | |
| 10 | 43 | 21 | 97 | 32 | 151 | 43 | 211 | | |

An INTROW table stores the four inter-row permutation sequences, $P_A$, $P_B$, $P_C$, and $P_D$. The $P_A$, $P_B$, $P_C$, and $P_D$ sequences respectively include 20, 20, 10, and 5 entries, and are respectively stored starting at addresses 0, 20, 40, and 50 in the INTROW table.

An INTRABASE table stores the 52 intra-row base sequences $c(i)$ for the 52 prime numbers p listed in the PRIME table. As shown in equation (1), each prime number p is associated with a respective intra-row base sequence $c(i)$ having a length of p−1. The elements of $c(i)$ range in value from 1 to 256, and c(i)−1 instead of c(i) may be stored in the INTRABASE table using 8 bits. The stored values of c(i)−1 for the intra-row base sequences $q(i)$ may be used directly when C=p−1. When C=p or C=p+1, the stored values of c(i)−1 is added with one to obtain c(i), which is then used.

An INTRADDR table stores the starting addresses of the 52 intra-row base sequences $c(i)$ stored in the INTRABASE table. Since each base sequence $c(i)$ has a variable length (i.e., of p−1), the INTRADDR table is used to quickly identify the starting address of each base sequence $c(i)$ in the INTRABASE table. This starting address is used as an offset to retrieve individual elements of the desired base sequence.

A Y table stores the 52 prime number sequences $q_j$ for the 52 prime numbers p listed in the PRIME table. As shown in equation set (2), each prime number p is associated with a respective prime number sequence $q_j$ having a length of R, where R is 5, 10, or 20 and is mostly 20. In an alternative embodiment, the permutated prime number sequences $p_j$ may be stored in the Y table instead. The R elements of each prime number sequence $q_j$ are permutated by an associated inter-row permutation sequence $P_X$, which can be $P_A$, $P_B$, $P_C$, or $P_D$ depending on the code segment size K. Thus, each prime number sequence $q_j$ may be permutated based on its associated inter-row permutation sequence $P_X$ and stored as the permutated prime number sequence $p_j$.

Each of the R elements in the permutated prime number sequence $p_j$ is used to generate a respective intra-row permutation sequence $c_j(i)$, as shown in equation (4). The elements for the intra-row permutation sequence $c_j(i)$ for each row are derived as:

$$c_j(i) = c([i \cdot p_j] \text{ modulo } (p-1))$$
$$= c(x),$$

where $x=[i \cdot p_j]$ modulo (p−1). The argument x for the base sequence $c(x)$ can also be expressed as:

$$x=[i \cdot \{p_j \text{modulo}(p-1)\}]\text{modulo}(p-1).$$

To reduce the amount of required storage and to simplify subsequent computations based on the permutated prime number sequence $p_j$, the elements of the prime number sequence $q_j$ may be stored after a modulo (p−1) division, which can be expressed as:

$$q_{j,p}=q_j\text{modulo}(p-1).$$

Thus, $q_j$ modulo (p−1) is stored in the Y table instead of $q_j$. It can be shown that the largest number for all 52 sequences is 89, and each element can thus be stored using 7 bits.

In an embodiment, to simply the addressing of the Y table, each of the 52 sequences $q_j$ is stored using 20 entries in the Y table, with each sequence being stored starting at a respective starting address. The entries in each sequence may be addressed using the formula: pind*20+offset, where pind is the index of the prime number p associated with the sequence, and offset is the offset of the desired element in the sequence.

FIG. 7 shows the tables that may be used to expedite the address generation for the interleaving scheme defined by the W-CDMA standard. The PRIME table includes 52 entries for 52 prime numbers p. The INTROW table includes 55 entries for the four inter-row permutation sequences $P_A$, $P_B$, $P_C$, and $P_D$. The INTRABASE table includes approximately 6K entries for the 52 intra-row base sequences $c(i)$ for the 52 prime numbers p at 52 different starting addresses. The INTRADDR table includes 52 entries for the starting addresses of the 52 intra-row base sequences $c(i)$ stored in the INTRABASE table. And the Y table includes 1040 entries for the 52 prime number sequences $q_j$ corresponding to the 52 prime numbers p.

A procedure can be devised to generate interleaved addresses for a given code segment size K with known R and C using the tables defined above. This procedure may be expressed using pseudo-code as shown below. A description for the pseudo-code is also provided subsequently.

```
10    p = PRIME(pind);
20    intra_st = INTRADDR(pind);
30    r_in = 0;
40    c_in = 0;
```

-continued

```
50      for (1=0; i<K; i++) {
60      LOOP:
70          r_new = INTROW[introw_st+r_in];
80          pj = Y[pind*20+r_in];
90          if (c_in==0) c_idx[r_in] = 0;
100         elseif (c_in<p-1) {
110             c_idx[r_in] = c_idx[r_in]+pj;
120             if (c_idx[r_in] ≧ p-1)
130                 c_idx[r_in] = c_idx[r_in]-p+1;
140         }
150         if (C==p-1) c_new =
INTRABASE[intra_st+c_idx[r_in]];
160         else {
170             elseif (c_in<p-1) {
180                 c_new =
INTRABASE[intra_st+c_idx[r_in]]+1;
190                 if (K==R*C && C==p+1 && r_new==R-1 &&
c_in==0) {
200                     last = c_new;
210                     c_new = p;
220                 }
230             }
240             elseif (c_in==p-1) c_new=0;
250             elseif (c_in==p) {
260                 if (K==R*C && C==p+1 && r_new==R-1)
c_new=last;
270                 else c_new=p;
280             }
290         }
300         addr_new = r_new*C+c_new;
310         r_in++
320         if (r_in=R) { c_in++; r_in=0; }
330         if (addr_new>K-1) goto LOOP;
340     }
```

The above pseudo-code generates interleaved addresses as follows. The K elements in a code segment are assumed to be written into an R×C array in the manner described above and in FIG. 6A (i.e., row-by-row). The following parameters are also assumed to be known for the code segment prior to executing the pseudo-code: K, R, C, pind, and introw_st, where pind is the index for the PRIME table and introw_st is the starting address of the desired inter-row permutation sequence $P_X$ in the INTROW table. These parameters may be provided by a controller (e.g., controller 540 in FIG. 5) having information about the size of the code segment being processed.

Initially, the prime number p is determined from the PRIME table using the index pind (line 10) and the starting address for the corresponding base sequence c(i) is determined from the INTRADDR table (line 20). The variables r_in and c_in used for the current row and column numbers, respectively, are initialized to zero (lines 30 and 40).

A FOR loop is then executed to generate an interleaved address for each of the K elements in the code segment (lines 50 and 60). For each element in the code segment, the row and column numbers, r_new and c_new, for the location of the element in the R×C array after the interleaving are generated by the procedure. First, the permuted row number, r_new, corresponding to the current row number, r_in, is determined based on the inter-row permutation sequence $P_X$ retrieved from the INTROW table (line 70).

The permuted column number, c_new, is next determined. This is achieved by first retrieving the element in the prime number sequence $q_j$ corresponding to the current row, r_in, from the Y table (line 80). The expression:

$$c_j(i)=c([i \cdot q_j] \mathrm{modulo}(p-1))=c(x),$$

is then determined by first evaluating the argument x. It can be shown that the argument x can be evaluated recursively using a few steps. First, if $x_{i-1}=[(i-1) \cdot q_j] \mathrm{modulo}(p-1)$, for i>1, 2, . . . , p-2,
then $x_i=[x_{i-1}+q_j] \mathrm{modulo}(p-1)$, where $x_0=0$.

Thus, the multiplication operation for $[(i-1) \cdot q_j]$ can be replaced with an addition operation for $[x_{i-1}+q_j]$. Second, since $x_i<2 \cdot (p-1)$ because $q_j \leq (p-1)$ since it is stored after the modulo by (p-1), the modulo (p-1) operation to generate $x_i$ can be achieved by simply subtracting (p-1) from $x_i$ if $x_i$ is greater than (p-1). If the argument x is to be solved recursively, a temporary array c_idx[ ] is used to store the current value of x (i.e., $x_i$), which is later used to calculate the next value of x (i.e., $x_{i+1}$).

The element in the temporary array c_idx[ ] for the current row, r_in, is set to 0 for the first column (line 90). For each subsequent column, the value $q_j$ associated with the current row, r_in, is retrieved from the Y table and added to the previous argument value (i.e., $x_{i-1}$), which is stored in the temporary array at c_idx[r_in] (lines 100 and 110). If the resultant value is equal to or greater than (p-1), the modulo by (p-1) is achieved by subtracting the resultant value by (p-1) to generate the argument x for the current column (lines 120 and 130).

The value for $c_j(i)$ is then obtained by looking up the $x^{th}$ element in the base sequence c(i), which is stored in the INTRABASE table starting at the offset of intra_st. If the number of columns C is equal to (p-1), then the value of $c_j(i)-1$ obtained from the INTRABASE table is used directly, as shown by the first equation in equation set (5) (line 150). Otherwise, the value of $c_j(i)-1$ obtained from the INTRABASE table is increased by one to obtain $c_j(i)$, which is then used for input column numbers 0 through (p-2) (lines 160 to 180).

If K=R·C and C=p+1, then $c_{R-1}(p)$ is exchanged with $c_{R-1}(0)$, as shown by the last equation in equation set (5). This is achieved by saving $c_{R-1}(0)$ to a variable "last" when r_in=R-1 and c_in=0 (lines 190 and 200) and setting c_new to $c_{R-1}(p)$, which is equal to p when C=p+1, as shown by the third equation in equation set (5) (line 210). (c_new is initially set to $c_{R-1}(0)$ in line 180 and "last" is then set to c_new is line 200, thus storing $c_{R-1}(0)$ to "last".) And later when r_new=R-1 and c_in=p, c_new is set to $c_{R-1}(0)$, which was previously stored in the variable "last" (lines 250 and 260).

If c_in=p-1, then c_new is set to zero since $c_j(p-1)=0$, as shown by the second and third equations in equation set (5) (line 240). And when c_in=p (except when K=R·C, C=p+1, and r_in=R-1, in which case $c_{R-1}(p)$ is exchanged with $c_{R-1}(0)$), c_new is set to p since $c_j(p-1)=p$, as shown by the third and fourth equations in equation set (5) (lines 250 to 270).

The variables r_new and c_new represent the row and column numbers in the R×C array after the interleaving. Since the elements in the code segment are stored in a one-dimensional storage unit (e.g., at addresses of 0 through K-1), the permuted row and column numbers, r_new and c_new, are converted into an interleaved address, addr_new (line 300). Thus, the element at memory address of i maps to memory address of addr_new after interleaving.

The input row and column numbers, r_in and c_in, are then incremented (lines 310 and 320). Since the elements in the interleaved array are read out column-by-column, the row number is incremented first and the column number is incremented only if the row counter reaches the end of the R×C array (line 320), in which case the row number is reset to zero.

The generated interleaved address, addr_new, may exceed the size of the code segment K-1. As shown in FIG. 6A, the code segment size K may be less than R·C, in which case one or more cells in the R×C array are not used. Thus, when addr_new≧K, this condition indicates that there is no valid data for the generated address and a new interleaved address is computed. The last "If" clause in the pseudo-code (line 330) handles this situation and computes another interleaved address by returning to the start of the LOOP (at line 60).

The interleaved address generation techniques described above may be implemented in software, hardware, or a combination thereof. For certain applications (e.g., high rate Turbo decoding), the interleaved addresses may need to be generated at a high rate. For these applications, hardware circuitry in combination with the look-up tables may be used to quickly generate the required interleaved addresses.

In an embodiment, to ensure that one valid interleaved address is generated for each clock cycle, two address generation units are provided to concurrently generate two new addresses. As noted above, the computed interleaved address, addr_new, may exceed the code segment size K and would therefore not be valid. If the first interleaved address is within the valid range (addr_new<K), then this address is used and the second interleaved address is discarded. However, if the first interleaved address generated is outside the valid range (i.e., addr_new≧K), then this address is discarded and the second interleaved address is used. Two address generation units are sufficient because of a Turbo interleaver property that no two consecutive interleaving addresses will be invalid.

Figure 8:
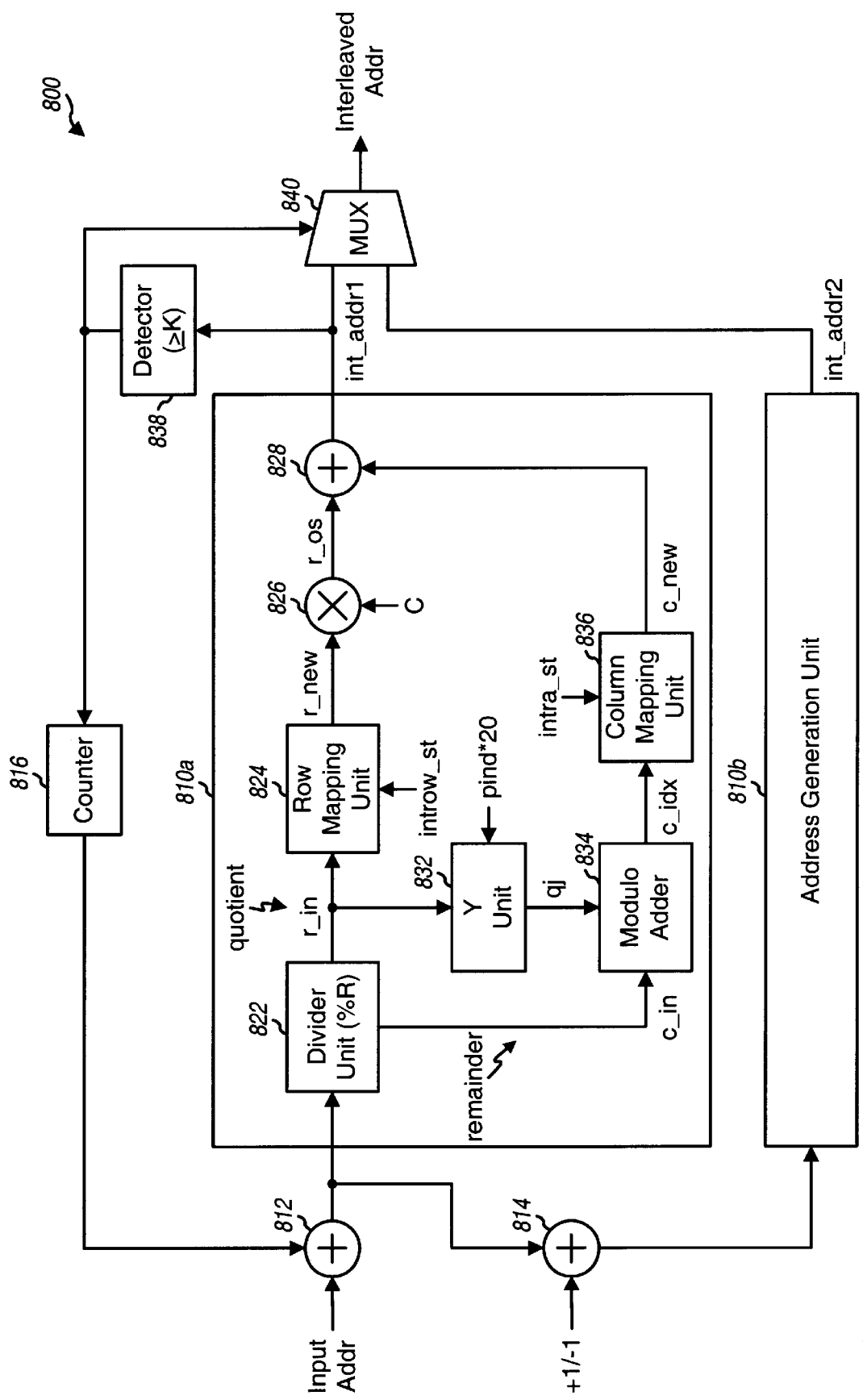
FIG. 8 is a block diagram of an address generator capable of providing interleaved addresses, in accordance with an embodiment of the invention.

FIG. 8 is a block diagram of an address generator 800 capable of providing interleaved addresses, in accordance with an embodiment of the invention. Address generator 800 approximately implements the pseudo-code described above and includes two address generation units 810a and 810b capable of generating two interleaved addresses concurrently. If a valid interleaved address is needed by the Turbo decoder for every clock cycle, then two address generation units 810 can be used to ensure that at least one valid interleaved address is generated for each clock cycle.

As shown in FIG. 8, a (linear) input address is summed by an adder 812 with a bad address count value, bad_addr_cnt, from a counter 816 to derive a first address. Initially, counter 816 is set to zero at the start of the code segment. The first address is then provided to address generation unit 810a. Subsequently, the input address is incremented regularly (e.g., by one for each clock cycle). Each time a "bad address" is registered, counter 816 is "advanced" by one count in the linear address (input address). Counter 816 counts the number of "advances" needed for the input address and used as an appropriate offset from the input address. For example, if the input address is equal to two when a bad address is encountered, then bad_addr_cnt increments to one and the first address provided to the address generator is then three instead of two. If another bad address is encountered when the input address is equal to five, then bad_addr_cnt increments to two, and the first address provided to the address generator is then seven instead of five.

Within address generation unit 810a, the first address is provided to a divider unit 822 that divides the first address by R and provides a quotient indicative of the input row, r_in, and a reminder indicative of the input column, c_in, in the R×C array corresponding to the first address. The input row number, r_in, is then mapped to a permutated row number, r_new, by a row mapping unit 824 that performs the inter-row permutation using the INTROW table. This permutated row number is multiplied with the number of columns, C, by a multiplier 826, and the resultant product, r_os, is indicative of a starting address (i.e., the row offset) in the storage unit for the permutated row, r_new.

The input row number, r_in, is also provided to a unit 832 that provides a prime number qj associated with that row number, as indicated by pind. Unit 832 includes or references the Y table to provide qj. The prime number qj and the input column number, c_in, are provided to a modulo adder 834 to generate a column index, c_idx, for the intra-row permutation (i.e., $c\_idx = [ixq_j]$ modulo $(p-1)$, as shown in equation (4)). This column index, c_idx, is provided to a column mapping unit 836, which provides a permutated column number, c_new, corresponding to this input address. Unit 836 includes or references the INTRABASE table to derive the permutated column number, c_new. An adder 828 then receives and adds the permutated column number, c_new, with the starting address of the row, r_os, to generate the first interleaved address, int_addr1.

The first address is also either incremented or decremented by an adder 814 (depending on whether the input address is being incremented or decremented, respectively) to provide a second address for address generation unit 810b. This second address is adjacent to the first address, and is used if the first address results in an invalid interleaved address. Unit 810b operates in similar manner as unit 810a, and provides the second interleaved address, int_addr2, corresponding to the second address.

A detector 838 receives the first interleaved address, int_addr1, and determines whether or not this address is valid (i.e., whether int_addr1<K). If the first interleaved address generated by address generation unit 810a is valid, then this address is provided from a multiplexer 840 as the interleaved address, int_addr, and the second interleaved address generated by unit 810b is discarded. However, if the first interleaved address is invalid (i.e., out of range, or int_addr1≧K), then this address is discarded and the second interleaved address is provided from multiplexer 840 as the interleaved address and counter 816 is incremented. Multiplexer 840 thus receives the first and second interleaved addresses, int_addr1 and int_addr2, and provides one of these addresses as the output interleaved address, int_addr, based on a control signal from detector 838.

Counter 816 counts the number of bad addresses generated for the code segment. The bad address count, bad_addr_cnt, from counter 816 is added to the input address by adder 812 to generate an updated input address (i.e., the first address) for the interleaved address calculation.

Figure 9:
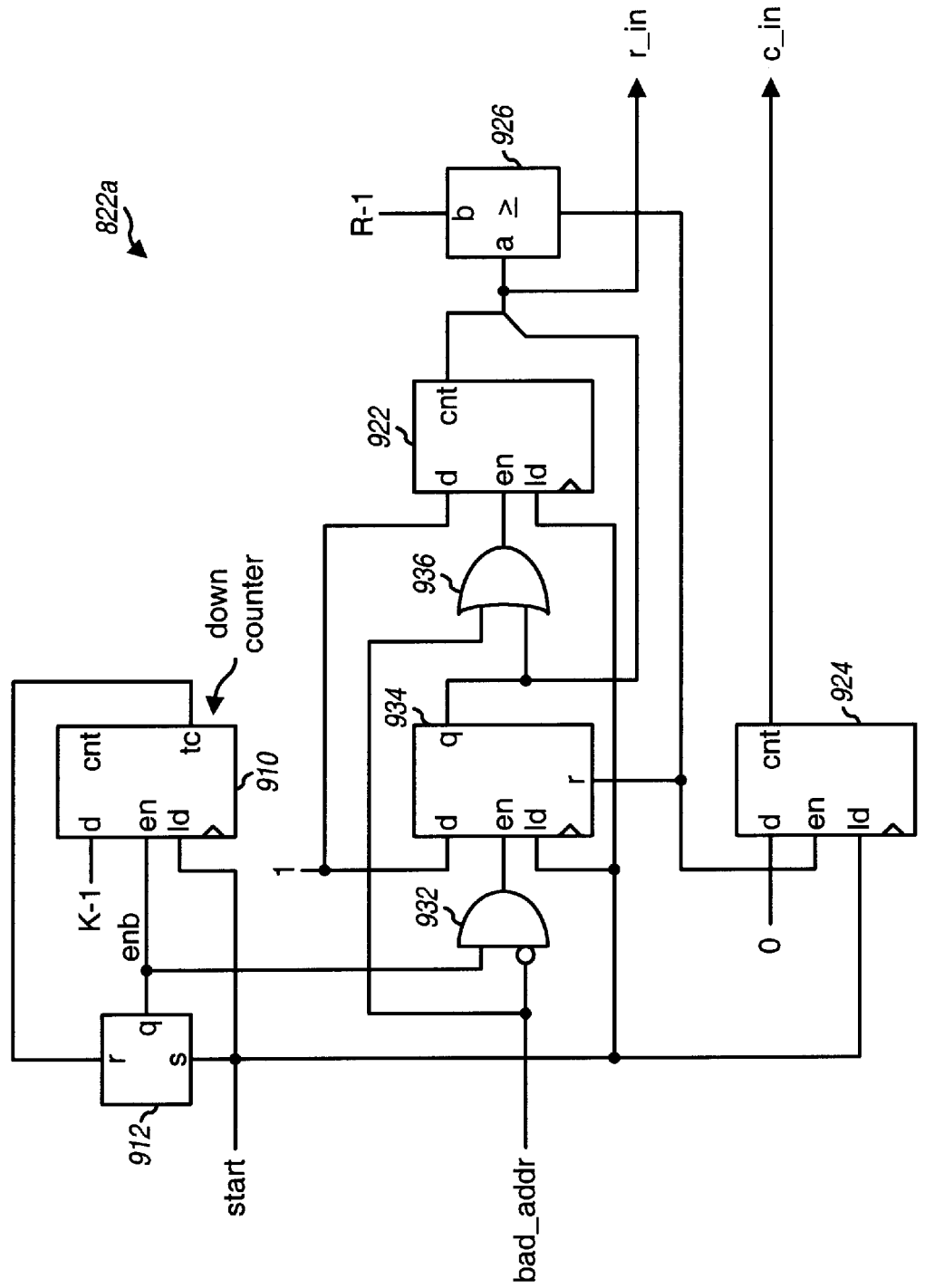
FIG. 9 is a diagram of a unit capable of generating a sequence of input row and column numbers for a sequence of sequential input addresses.

FIG. 9 is a diagram of a unit 822a capable of generating a sequence of input row and column numbers, r_in and c_in, for a sequence of sequential input addresses, in accordance with an embodiment of the invention. Unit 822a is one implementation of divider unit 822 in FIG. 8. It is assumed that the elements of the code segment have been stored in linear order and are to be retrieved in interleaved order.

Within unit 822a, a counter 910 is used to count down the number of elements in the code segment. Counter 910 is initially loaded with the value of K−1 by a control signal "start" and thereafter counts down to zero. When counter 910 reaches zero, a register 912 is reset to low and no row and column numbers are generated until the start control signal sets the register. Register 912 provides a control signal "enb" that enables the generation of K sets of row and column numbers for the code segment.

Unit 822a uses two counters to generate the row and column numbers, r_in and c_in, instead of performing a divide operation since the input addresses are sequential. A counter 922 generates the row number, r_in, and is incremented first since the R×C array is accessed column-by-column in the interleaved addressing order. A counter 924 generates the column number, c_in, and is incremented second after the row number reaches R−1, as determined by a comparator 926. Since bad addresses are occasionally generated as described above, counter 922 skips one count (i.e., counts by 2) when a bad address is detected. This mechanism automatically skips over bad addresses. It can be noted that a value of one ('1') is loaded into row counter 922 when a skip occurs after the row counter reaches R−1. AND gate 932, register 934, and OR gate 936 allow counter 922 to be incremented by two when "bad_addr" is True.

If the input addresses are decremented instead of incremented, then the row and column counters count down instead of up (not shown in FIG. 9). Decremented interleaved addresses may be required for some Turbo decoder designs.

The address generation techniques described herein may be used to generate interleaved addresses for the downlink as well as the uplink Turbo code in the W-CDMA system.

For clarity, the address generation has been described for a specific Turbo code interleaving scheme defined by the W-CDMA standard. Each CDMA standard may define a code interleaving scheme that is different from those of other CDMA standards, including the W-CDMA standard. For example, the cdma2000 standard defines an interleaving scheme whereby the rows are permutated in accordance with a bit-reversal rule, e.g., row 1 ("00001") is swapped with row 16 ("10000"), row 3 ("00011") is swapped with row 24 ("11000"), and so on. For these different code interleaving schemes, the sequences to be stored in the tables are likely to be different from those described above for the interleaving scheme defined by the W-CDMA standard.

The address generation techniques described herein may be implemented in software, hardware, or a combination thereof. For a hardware implementation, the address generator may be implemented within one or more digital signal processors (DSP), application specific integrated circuits (ASIC), processors, microprocessors, controllers, microcontrollers, field programmable gate arrays (FPGA), programmable logic devices, other electronic units, or any combination thereof. The address generator may be implemented as a separate unit, integrated within a controller or the storage unit, implemented within an ASIC that also includes other processing elements, or via some other design. For a software implementation, the interleaved addresses may be generated by program codes executed on a processor (e.g., controller 540 in FIG. 5). An example pseudo-code that may be used to generate interleaved addresses is described above, and many other implementations are also possible and within the scope of the invention.

The tables and storage unit may also be implemented with various memory technologies such as, for example, random access memory (RAM), dynamic RAM (DRAM), Flash memory, and others. Various structures and implementations of the tables and storage unit are possible and within the scope of the present invention.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A turbo interleaver utilizing a plurality of tables, where for a given K with known R, C, and pind, is derived a W-CDMA compatible turbo interleaver address, the interleaver comprising:
   an inter-row table comprising a plurality of inter-row permutation tables;
   a prime number table;
   a first unit operable to generate prime number index information;
   an intra-row base sequence table (INTRABASE);
   an intra-row base sequence addressing table (INTRADDR);
   a (q) sequence table; and
   interleaver hardware logic coupled to the first unit and to each of the tables for generating the W-CDMA compatible turbo interleaver address.

2. An interleaver for a concatenated convolutional (Turbo) code, comprising:
   a storage unit configured to store a plurality of (K) elements for a data packet at locations representative of a two-dimensional array, wherein the elements are stored into the storage unit in a first order and provided from the storage unit in a second order;
   a first set of at least one table configured to store a first set of sequences of values used to perform row permutation of the two-dimensional array to map from the first order to the second order;
   a second set of at least one table configured to store a second set of sequences of values used to perform column permutation of the two-dimensional array to map from the first order to the second order; and
   an address generator coupled to the storage unit and the first and second sets of tables and configured to receive a first address for the first order and generate a corresponding second address for the second order based in part on the sequences stored in the first and second sets of tables.

3. The interleaver of claim 2, wherein the first order is linear and corresponds to access of the K elements at linear positions in the data packet, and the second order is interleaved and corresponds to access of the K elements at interleaved positions in the data packet.

4. The interleaver of claim 2, wherein the first and second orders are defined by W-CDMA standard.

5. The interleaver of claim 2, further comprising:
   a third set of at least one table configured to store values for a parameter used to generate the second address for the second order.

6. The interleaver of claim 5, wherein the parameter values stored in the third set of at least one table include a set of prime numbers defined for use to derive the second order.

7. The interleaver of claim 2, wherein the first set of at least one table includes a first (INTROW) table configured to store a plurality of first sequences of values, where each first sequence is used to maps a row number in the first order to a respective row number in the second order.

8. The interleaver of claim 2, wherein the second set of at least one table includes a second (INTRABASE) table configured to store a plurality of second sequences of values, where each second sequence maps a column index for the first order to a respective column number in the second order.

9. The interleaver of claim 8, wherein the plurality of second sequences correspond to a plurality of prime numbers, and wherein one second sequence is selected for use for the data packet based on the value of K.

10. The interleaver of claim 8, wherein the second set of at least one table further includes a third (Y) table configured to store a plurality of third sequences of values, where each third sequence includes values used to derive column indices.

11. The interleaver of claim 2, wherein the address generator is configurable to derive an input row number and an input column number corresponding to the first address and to further derive an interleaved row number and an interleaved column number corresponding to the input row and column numbers, respectively, based in part on the first and second sets of tables.

12. The interleaver of claim 2, wherein the address generator is configurable to provide at least one valid second address for each clock cycle.

13. The interleaver of claim 2, wherein the address generator includes:
at least two address generation units, each unit configured to receive a respective first address and generate a second address corresponding to the received first address.

14. The interleaver of claim 13, wherein consecutive first addresses are provided to the at least two address generation units.

15. The interleaver of claim 2, wherein the plurality of elements are intermediate results from Turbo decoding.

16. An address generator operable to generate addresses for a storage unit configured to store data for a concatenated convolutional (Turbo) code, wherein a plurality of (K) elements for a data packet are stored at locations in the storage unit representative of a two-dimensional array, and wherein the elements are stored into the storage unit in a first order and provided from the storage unit in a second order, the address generator comprising:
a first unit configured to provide an input row number and an input column number for the two-dimensional array corresponding to a first address for the first order;
a row mapping unit coupled to the first unit and configured to receive the input row number and provide a corresponding permutated row number;
a column mapping unit coupled to the first unit and configured to receive at least the input column number and provide a corresponding permutated column number;
a combiner unit coupled to the row and column mapping units and configured to receive and combine the permutated row and column numbers to generate a second address for the second order; and
a first set of at least one table configured to store a first set of sequences of values used to perform row permutation of the two-dimensional array to map from the first order to the second order and a second; and
a second set of at least one table configured to store a second set of sequences of values used to perform column permutation of the two-dimensional array to map from the first order to the second order, and
wherein the permutated row and column numbers are derived based on values retrieved from the first and second set of tables.

17. The address generator of claim 16, wherein the first and second order are defined by W-CDMA standard.

18. The Turbo decoder comprising:
a constituent decoder configured to receive and decode coded bits in accordance with a particular constituent code to generate intermediate results;
a storage unit coupled to the constituent decoder and configured to store the intermediate results at locations representative of a two-dimensional array, wherein the intermediate results are stored into the storage unit a first order and provided from the storage unit in a second order; and
an address generator coupled to the storage unit and configured to receive a first address for the first order and generate a second address for the second order based in part on sequences of values stored in a set of tables, wherein the sequences are used to perform row and column permutation of the two-dimensional array to map from the first order to the second order.

19. The Turbo decoder of claim 18, wherein the first and second order are defined by W-CDMA standard.

20. The Turbo decoder of claim 18, wherein the address generator is configured to provide at least one valid second address for each clock cycle.

21. A method for generating addresses for a concatenated convolutional (Turbo) code, wherein a plurality of (K) elements for a data packet are stored at locations in a storage unit representative of a two-dimensional array, and wherein the elements are stored into the storage unit in a first order and provided from the storage unit in a second order, the method comprising:
determining an input row number and an input column number for the two-dimensional array corresponding to a first address for the first order;
accessing a first set of at least one table to retrieve a first set of at least one sequence of values used to perform row permutation of the two-dimensional array to map from the first order to the second order;
mapping the input row number to a permutated row number based on the retrieved first set of at least one sequence;
accessing a second set of at least one table to retrieve a second set of at least one sequence of values used to perform column permutation of the two-dimensional array to map from the first order to the second order;
mapping the input column number to a permutated column number based on the retrieved second set of at least one sequence; and
combining the permutated row and column numbers to generate a second address for the second order.

* * * * *